219-121
11/30/76     XR     3,995,186

United States Patent [19]
Kaminsky et al.

[11] B 3,995,186
[45] Nov. 30, 1976

[54] ION-PLASMA GUN FOR ION-MILLING MACHINE

[75] Inventors: Manfred S. Kaminsky; Thomas J. Campana, Jr., both of Hinsdale, Ill.

[73] Assignee: The United States of America as represented by the United States Energy Research and Development Administration, Washington, D.C.

[22] Filed: Apr. 25, 1975

[21] Appl. No.: 571,659

[44] Published under the second Trial Voluntary Protest Program on April 13, 1976 as document No. B 571,659.

[52] U.S. Cl. .................... 313/231.4; 219/121 P
[51] Int. Cl.² ................... H01J 17/04; H05H 1/00
[58] Field of Search ............ 313/231.4, 231.3, 217; 315/111.2; 219/121 P

[56] References Cited
UNITED STATES PATENTS

| | | | |
|---|---|---|---|
| 3,097,292 | 7/1963 | Kugler et al. | 219/121 P |
| 3,347,698 | 10/1967 | Ingham, Jr. | 315/111.2 |
| 3,579,028 | 5/1971 | Cheng | 315/111.2 |

*Primary Examiner*—Palmer C. Demeo
*Attorney, Agent, or Firm*—Dean E. Carlson; Arthur A. Churm; Hugh W. Glenn

[57] ABSTRACT

An ion gun includes an elongated electrode with a hollow end portion closed by a perforated end plate. The end plate is positioned parallel to a perforated flat electrode of opposite electrical polarity. An insulated sleeve encompasses the elongated electrode and extends outwardly from the perforated end towards the flat electrode. The sleeve length is separated into two portions of different materials. The first is formed of a high-temperature material that extends over the hollow portion of the elongated electrode where the arc is initiated by a point source electrode. The second sleeve portion extending over the remainder of the elongated electrode is of a resilient material for enhanced seal-forming ability and retention of plasma gas. Perforations are arranged in the flat electrode in a mutually opposing triangular pattern to project a plasma beam having a generally flat current profile towards a target requiring precision milling.

5 Claims, 4 Drawing Figures

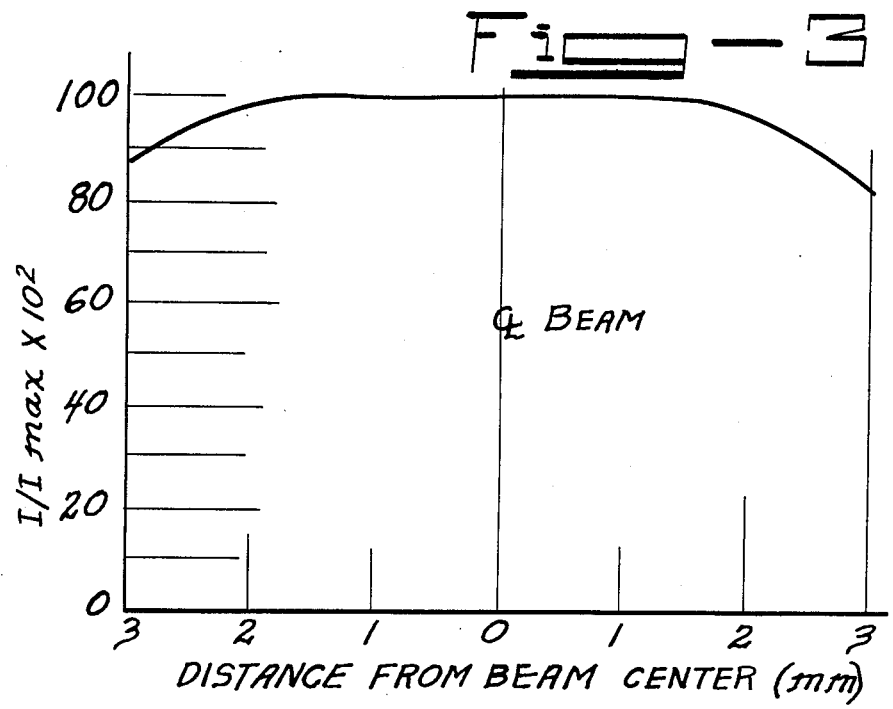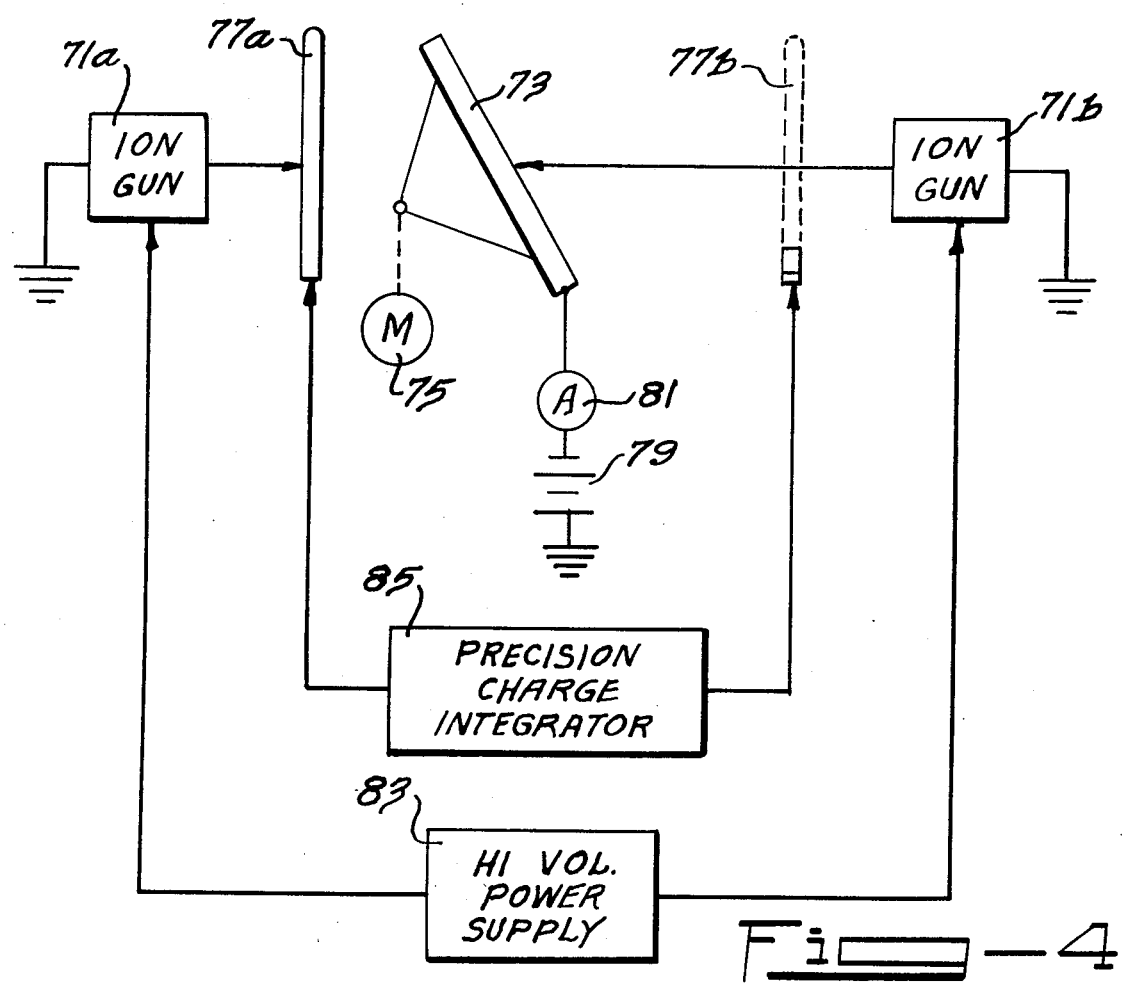

ION-PLASMA GUN FOR ION-MILLING MACHINE

CONTRACTUAL ORIGIN OF THE INVENTION

The invention described hereinw was made in the course of, or under, a contract with the UNITED STATES ENERGY RESEARCH AND DEVELOPMENT ADMINISTRATION.

BACKGROUND OF THE INVENTION

In the preparation of specimens for examination by transmission electron microscopy, ion-milling machines have been employed for producing specimen thicknesses on the order of 1 micrometer. An ion-milling machine for this purpose will include at least two oppositely disposed, ion plasma guns directed towards opposing surfaces of the specimen. The force exerted by each plasma beam can thereby be balanced to prevent specimen bulging. Thin-foil specimens prepared in this manner are of value in studying transmission ion scattering or Rutherford scattering as one means of determining radiation damage in previously exposed materials.

Ordinarily, each ion-plasma gun includes an elongated first electrode with a hollow end portion and a perforated closure along with a flat, perforated second electrode. An ionizable gas is supplied at less than atmospheric pressure into the space between the electrodes and into the hollow end portion of the first electrode. The first electrode is connected to a source of high electrical potential and is insulated from the gun housing by a dielectric sleeve concentric with the electrode. In this type of arrangement the second electrode can be gounded to the gun housing.

Heretofore ion-plasma guns of this type have included a number of problems and disadvantages which rendered such milling operations tedious and difficult. Insulating and sealant material disposed within high-temperature regions have vaporized and degraded, causing carbonaceous deposits on the electrodes. Often arc initiation voltages of 2 to 3 times the operating voltage are required and are not reduced promptly enough to prevent intense degradation of these materials. Difficulties in arc initiation are aggravated when an inadequate amount of ionizable gas is provided into the space beween the electrodes. Consequently, frequent disassembly and cleaning have been necessary to maintain adequate milling characteristics.

Another and perhaps more serious difficulty has been the inability to achieve uniform specimen thickness across a milled area. Regions of variable thickness within a specimen interfere with accurate examination by electronic microscopy. Previous attempts to improve uniformity have involved rotating the specimen during the milling operation. Although this procedure has resulted in some improvement in uniformity, the elevated temperatures near the arc center have tended to produce a dish-shaped milled region.

Therefore, in view of these disadvantages within prior art, ion-plasma guns, it is an object of the present invention to provide an improved plasma gun capable of achieving uniform specimen thickness.

It is a further object to provide a plasma gun constructed to minimize degradation of insulating members and resulting electrode fouling.

It is also an object to provide a plasma gun capable of arc initiation at reduced voltages.

SUMMARY OF THE INVENTION

The inventors, being aware of the foregoing problems, have developed an improved ion-plasma gun comprising an elongated electrode having a hollow end portion with a perforated closed end enclosing a point source electrode mounted coaxially and in electrical contact with the electrode. An insulating sleeve including a refractory portion for high temperatures and a resilient portion for gas sealing is disposed along the length of the elongated electrode and outwardly from the perforated end. A perforated flat electrode is mounted adjacent to the sleeve and essentially parallel to the perforated end of the elongated electrode. The ion gun includes means for providing an ionizable gas between the flat and elongated electrodes and within the hollow portion of the elongated electrode. Suitable electrical connections are made to maintain the flat electrode at opposite electrical polarity to the elongated and point electrodes whereby an ion plasma is produced.

Another aspect of the invention is a pattern of perforations through the flat electrode outlining two symmetrical, opposing triangles having a common apex at the electrode center. This pattern attenuates the high-intensity portion of the plasma at the electrode center and thereby provides a temperature profile of improved uniformity across the milling surface.

BRIEF DESCRIPTION OF THE DRAWINGS

The present invention is illustrated in the accompanying drawings wherein:

FIG. 3 is a graph showing a typical current profile normalized to maximum current at the center of an ion beam generated by the ion gun shown in FIG. 1.

FIG. 4 is a schematic diagram showing a typical arrangement of two ion guns being used to mill a workpiece.

DETAILED DESCRIPTION OF THE PREFERRED EMBODIMENT

Figure 1:
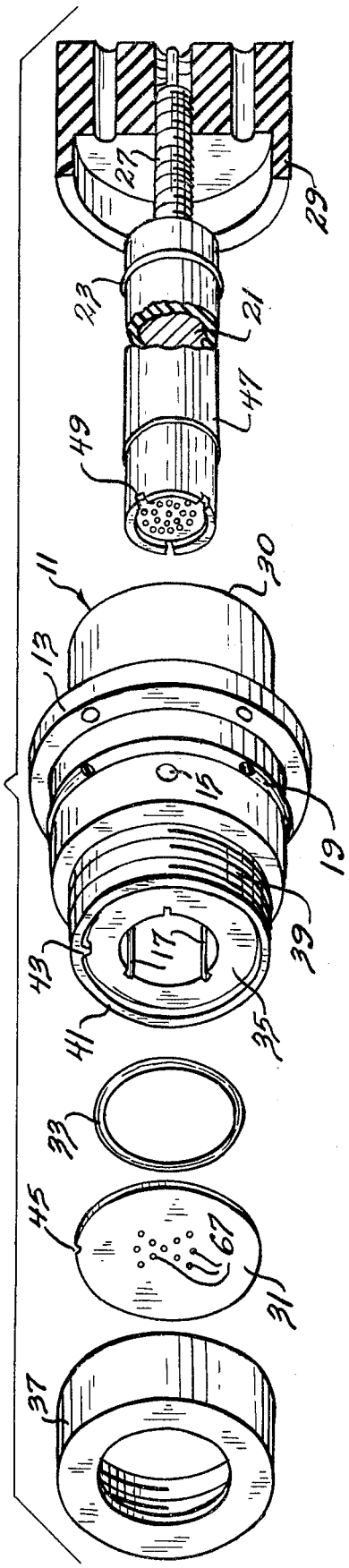
FIG. 1 is an exploded view of an ion gun assembly.

Referring to FIG. 1 where an ion-plasma gun assembly is shown with components exposed from within an elongated hollow housing 11. Housing 11 includes a flange portion 13 for mounting the assembled gun within a suitable support on a conventional and commercially available ion-milling machine. One such milling machine suitable for employing an ion gun assembly as described herein is a model I MM III available from Commonwealth Scientific Corporation.

Also provided within housing 11 is a port 15 suitable for connecting a vacuum source and a supply of ionizable gas such as argon or xenon at pressures of, for example, about $10^{-5}$ to $10^{-4}$ mm of mercury absolute. Several elongated grooves 17 are provided along the inner surfaces of housing 11 to let the ionizable gas flow into the ionplasma chambers as will be described below. An O-ring 19 seals the outer surfaces of housing 11 against mating surfaces within the ion-milling machine structure to maintain vacuum and prevent contamination of the ionizable gas.

An elongated electrode 21 (shown in more detail in FIG. 2) is adapted to be received within the inner passageway of housing 11 and includes an O-ring vacuum sealing means 23 for sealingly engaging the inner surfaces towards the rear portion of housing 11. At one end of electrode 21 is an electrical terminal or conductor 25 for connection to a source of high electrical potential. Conductor 25 passes through a threaded collar 27 suitable for engaging mating internal threads within an electrically insulative end cap 29. End cap 29 is mounted in abutment with the rear end surface 30 of housing 11. Thus, the extent to which threaded collar 27 is threaded into end cap 29 determines the penetration of the electrode 21 into housing 11. As will be seen, this adjustment will control the length of the arc chamber within the ion gun assembly.

A flat electrode 31 is shown for assembly at the front of housing 11 in sealing engagement by O-ring 33 or other suitable means to the forward surface 35 of the housing. A forward end cap 37 of electrically conductive material threadedly engages the forward periphery 39 of housing 11 and thereby tightly holds electrode 31 in engagement with sealing member 33. Forward end surface 35 is shown countersunk into the end of housing 11 except for an outer ridge 41 and an indexing tab 43. A matching groove 45 is cut through the peripheral edge of electrode 31 to insure proper electrode alignment with tab 43. An assembled electrode 31 and vacuum sealing means 33 are nested within the cavity formed by ridge 41 in end surface 35. Electrical connection is made to electrode 31 through its firm engagement within end cap 37 that is, in turn, threaded onto housing 11. Housing 11 is grounded to the ion-milling machine structure through flange 13.

Figure 2:
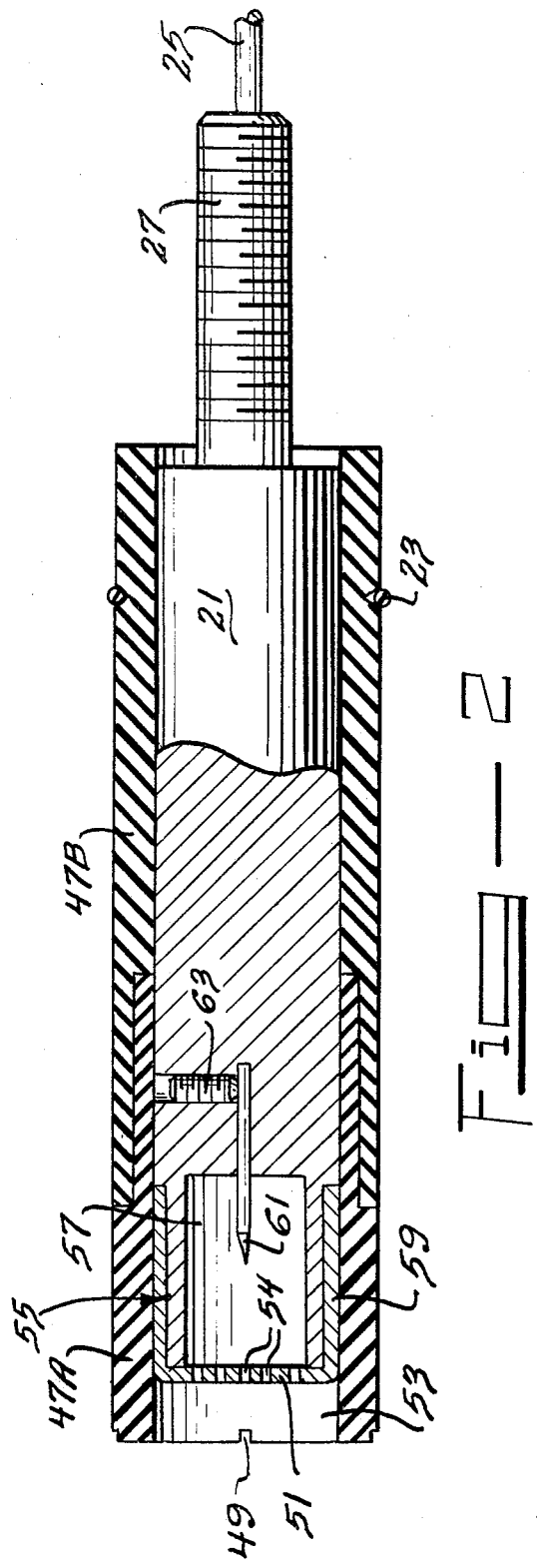
FIG. 2 is an enlarged cross-sectional view of an electrode within the FIG. 1 ion gun assembly.

Elongated electrode 21, shown in detail in FIG. 2, is constructed of a metallic electrically conductive material and includes a hollow end portion 55 closed by an end cap 59 to define a first ion plasma chamber 57. A plurality of perforations 54 are provided through cap 59 at its end surface 51 for passage of the ion plasma.

Electrode 21 is coaxially covered throughout its length with an electrically insulative sleeve 47 divided transversely into a forward portion 47A of a refractory, dielectric material and a rear portion 47B of a resilient, dielectric material. Forward portion 47A is preferably of a high-temperature material such as boron nitride and encompasses substantially the full length adapted to contain the ion plasma. Rear portion 47B is, for example, of Teflon (a registered tradename used herein to identify polytetrafluoroethylene) and extends over the remaining length of electrode 21 where the operating temperatures are reduced. The two sleeve portions are shown in inner and outer overlapping engagement to adequately insulate the metallic surface of electrode 21 from the ion gun housing 11. In furtherance of this purpose, sleeve 47A extends outwardly beyond the forward end surface 51 of electrode 21 to form a second, ion-plasma chamber 53. The distal or extended edge of sleeve portion 47A includes a plurality of symmetrically disposed slots 49 through the wall thereof for admitting ionizable gas introduced at port 15 into the plasma chambers.

A point source electrode 61 is shown coaxially mounted within plasma chamber 57 onto electrode 21 by suitable means such as set screw 63. Point source electrode 61 extends through approximately one-half the length of plasma chamber 57 and terminates in a point near the center of the chamber volume. On application of the high voltage to the electrode, its thin pointed geometry permits early breakdown of the ionizable gas at the center of the plasma chamber volume with resulting discharge initiation.

After initiating the arc within the first plasma chamber 57, it promptly spreads as a result of ionization through chamber 53 to the flat electrode 31. Electrode 31 is provided with a pattern of perforations 67 arranged as shown (FIG. 1) into two opposing triangles having a common apex at the center of the electrodes. This pattern of perforations provides a reduction in workpiece exposure towards the center of the discharge where the density of ionized particles within the plasma is at a peak. Thus the profile of plasma particles and, correspondingly, of electric current at the workpiece is more uniform than a current profile projected through a conventionally arranged pattern of perforations.

FIG. 3 presents a profile of current across the target or workpiece as a percentage of maximum current at the beam center ($I/I_{max}$). The measurements are made at approximately 3 cm from the exposed surface of electrode 31 and at a typical operating voltage of about 2.3 KV. The center or zero reference of the discharge corresponds to the apex of the two triangles in the pattern of perforations through electrode 31. It is seen from this graph that the current and therefore the density of plasma particles is substantially uniform over a major portion of the discharge.

The ion gun of the present invention is employed to mill specimens into a foil of uniform thickness in essentially the same manner as has been previously done. A typical arrangement is illustrated in FIG. 4 where two ion guns 71A and 71B are positioned on each side of the workpiece or target 73. The workpiece is ordinarily supported at an oblique angle to the ion beam on a suitable mount to permit its rotation by motor 75 during the milling operation. Two shutters 77A and 77B are positionable between the specimen and each ion gun for promptly terminating the milling operation when sufficient material has been cut away from the specimen. A source of direct current 79 in series with an ammeter 81 is connected to the workpiece to control secondary electron emission. A source of approximately 45 volts D-C is ordinarily sufficient for this purpose. A high-voltage power supply (approximately 5000 volts D-C) is connected to the elongated center electrode of each ion gun. After initiation of the milling operation, a signal from the high-voltage power supply representing current is transmitted to a precision charge integrator 85. After a predetermined electrical charge is registered within integrator 85, suitable control circuitry is activated to close shutters 77A and 77B to terminate the milling operation. By empirical means, sufficient application of charge can be determined to perform a particular milling requirement.

One improvement achieved through use of the ion-plasma gun described herein is illustrated by reduced voltages for discharge initiation. The arrangement of FIG. 4 had typically required about 4.5 KV for discharge initiation. The substitution of the improved ion-plasma guns has now reduced this to about 1.5 KV.

It will be clear that the present invention provides an improved ion-plasma gun for use within a conventional ion-milling machine. The gun is capable of milling thin-foil specimens of improved uniformity and thickness. It is also constructed to provide discharge initiation at voltages near the operating voltage and to minimize degradation of insulating members with resulting electrode fouling. Although the invention has been defined with respect to a specific embodiment, it will be clear to those skilled in the art that various modifications in materials and component parts can be made within the scope of the invention as is defined in the claims.

The embodiments of the invention in which an exclusive property or privilege is claimed are defined as follows:

1. A plasma gun for use within a ion-milling machine comprising an elongated, hollow housing; a first elongated electrode positioned lengthwise within said housing, said electrode including a hollow end portion with a perforated closed end to define a first plasma chamber; a second electrode comprising a point source mounted within and in electrical contact with said first electrode extending longitudinally within said first plasma chamber; an insulating sleeve disposed about said first electrode along the length thereof and outwardly from said perforated closed end; a third flat electrode mounted essentially parallel to and outwardly from said perforated closed end of said first electrode in sealing engagement with the inner surfaces of said housing to define a second plasma chamber; means for providing an ionizable gas about said insulating sleeve and within said first and second plasma chamber; and means for applying a voltage between said third electrode and said combined first and second electrodes to ionize said gas and provide a plasma.

2. The plasma gun of claim 1 wherein said third electrode is provided with a plurality of perforations through the thickness thereof, said perforations positioned to outline essentially mutually opposing first and second triangles having a common apex centrally disposed through said electrode.

3. The plasma gun of claim 1 wherein the end of said insulating sleeve outwardly from said first electrode is provided with a plurality of slots extending through the wall and symmetrically disposed about said sleeve.

4. The plasma gun of claim 1 wherein said insulating sleeve is divided transversely into first and second sleeve portions, said first sleeve portion comprises a refractory, electrically insulative material and encompasses said first and second plasma chambers, said second sleeve portion comprises a resilient material and extends from engagement with said first portion over the remainder of said first electrode length.

5. The plasma gun of claim 4 wherein said first sleeve portion is of boron nitride and said second sleeve portion is of polytetrafluoroethylene.

* * * * *